US008142847B2

(12) United States Patent
Shenai-Khatkhate et al.

(10) Patent No.: US 8,142,847 B2
(45) Date of Patent: Mar. 27, 2012

(54) PRECURSOR COMPOSITIONS AND METHODS

(75) Inventors: Deodatta Vinayak Shenai-Khatkhate, Danvers, MA (US); Stephen J. Manzik, Hampstead, NH (US); Qin-Min Wang, North Andover, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1016 days.

(21) Appl. No.: 12/074,373

(22) Filed: Mar. 3, 2008

(65) Prior Publication Data

US 2009/0017208 A1 Jan. 15, 2009

Related U.S. Application Data

(60) Provisional application No. 60/959,349, filed on Jul. 13, 2007.

(51) Int. Cl.
*C23C 16/22* (2006.01)
*C09D 5/00* (2006.01)

(52) U.S. Cl. ....... 427/255.36; 427/255.38; 427/255.394; 106/287.18; 106/287.19; 106/287.3

(58) Field of Classification Search .................. None
See application file for complete search history.

(56) References Cited

U.S. PATENT DOCUMENTS

| 6,143,357 A | 11/2000 | Shin et al. |
| 6,984,591 B1 | 1/2006 | Buchanan et al. |
| 7,166,732 B2 | 1/2007 | Xu et al. |
| 2005/0079290 A1 | 4/2005 | Chen et al. |
| 2006/0110930 A1 | 5/2006 | Senzaki |

FOREIGN PATENT DOCUMENTS

| EP | 1 640 475 | 3/2006 |
| EP | 1 921 061 | 5/2008 |
| GB | 2 399 568 A | 9/2004 |
| WO | WO 2004/046417 | 6/2004 |
| WO | WO 2006/021850 | 3/2006 |
| WO | WO 2007/005088 | 1/2007 |
| WO | WO 2007/015436 | 2/2007 |
| WO | WO 2008/128141 | 10/2008 |

OTHER PUBLICATIONS

Belluco et al. (Inorganic Chimica Acta 334(2002) 437-447.*
Montilla et al. Inorg. Chem. 1999, 38, 4462-4466.*
SciFinder search history.*
European Search Report of corresponding to European Application No. 08 16 0264.

* cited by examiner

*Primary Examiner* — Melvin Mayes
*Assistant Examiner* — Yun Qian
(74) *Attorney, Agent, or Firm* — S. Matthew Cairns (57) ABSTRACT

Compositions including an amido-group-containing vapor deposition precursor and a stabilizing additive are provided. Such compositions have improved thermal stability and increased volatility as compared to the amido-group-containing vapor deposition precursor itself. These compositions are useful in the deposition of thin films, such as by atomic layer deposition.

5 Claims, 2 Drawing Sheets

Fig. 1

*Prior Art*

Fig. 2

PRECURSOR COMPOSITIONS AND METHODS

This application claims the benefit of provisional patent application Ser. No. 60/959,349, filed on Jul. 13, 2007.

The present invention relates generally to the field of vapor deposition precursor compositions and their use in vapor deposition of thin films. In particular, the present invention relates to the field of amido-group-containing compounds useful as precursors for vapor deposition of thin films.

In atomic layer deposition ("ALD") processes, conformal thin films are deposited by exposing a surface to alternating vapors of two or more chemical reactants. Vapor from a first precursor (also referred to as organometallic compound, source or reactant) is brought to the surface onto which the desired thin film is to be deposited. Any unreacted vapor is then removed from the system under vacuum. Next, vapor from a second precursor is brought to the surface and allowed to react with the first precursor, with any excess second precursor vapor being removed. Each step in the ALD process typically deposits a monolayer of the desired film. This sequence of steps is repeated until the desired film thickness is obtained. In general, ALD processes are performed at low temperatures, such as from 200 to 400° C. The exact temperature range will depend on the particular film to be deposited as well as on the particular precursors employed. ALD processes have been used to deposit pure metals as well as metal oxides, metal nitrides, metal carbide nitrides, and metal silicide nitrides.

ALD precursors must be sufficiently volatile to ensure a sufficient concentration of the precursor vapor in the reactor to deposit a monolayer on the substrate surface within a reasonable period of time. The precursors must also be sufficiently stable to be vaporized without premature decomposition and unwanted side reactions, but must also be sufficiently reactive to form the desired film on the substrate. With such a required balance of volatility, surface reactivity, and thermal stability properties, there is an overall lack of suitable ALD precursors.

Precursor compounds containing a metal-oxygen bond, such as metal alkoxides and metal beta-diketonates, have been used to provide necessary thermal stability, however such precursor compounds have insufficient volatility and require relatively high temperatures in ALD processes. Precursors with metal-nitrogen bonds, particularly metal dialkylamides and metal amidinates, have been considered as promising candidates for use in ALD processes. The alkylamido precursors tend to possess high volatility since the alkylamido ligands effectively prevent neighboring precursor molecules from interacting with the metal center of the precursor compound. The alkylamido precursors nevertheless possess lower thermal stability than required for their use in ALD processes. The amidinate precursors, on the other hand, tend to be thermally more stable due to the chelating effect of the amidinato ligand, but possess relatively low volatility to be utilized practically in ALD applications. Certain conventional ALD processes utilize direct liquid injection process, in which the desired precursor compound is generally dissolved into a suitable organic solvent. However, it is difficult to select a solvent that matches with the volatility of the precursor to avoid particle generation during the vaporization; process. Sometimes, the desired ALD precursor is insufficiently soluble in such solvents to be of practical use in direct liquid injection processes.

Thus there remains a need for suitable sources with "Goldilocks effect", that is, the sources are appreciably volatile, preferably they are liquid or easily liquifiable low melting solids, with significantly greater thermal stability (as compared to conventional dialkylamido sources) and sufficiently organic solvent-soluble so as to meet ALD requirements and produce films that are of high uniformity, and substantially carbon-free and particle-free.

The present invention provides a composition for the vapor phase deposition of a thin film including an amido-group-containing vapor deposition precursor including a metal or metalloid chosen from a transition metal, phosphorus, antimony and arsenic, and a stabilizing additive compound capable of sharing electrons with the metal or metalloid, wherein the stabilizing additive compound is present in an amount of 0.01 to 3 molar equivalents based on the vapor deposition precursor. Such compositions have higher thermal stability with greater volatility as compared with the corresponding amido-group-containing precursor itself. The present invention further provides a vapor delivery cylinder including the above described composition.

Also provided by the present invention is a method of preparing the above described composition including combining the amido-group-containing vapor deposition precursor with the stabilizing additive compound; heating the combination of the vapor deposition precursor and the stabilizing additive; and mixing the vapor deposition precursor and the stabilizing additive to form a mixture.

The present invention further provides a method of depositing a thin film comprising providing a substrate in a vapor deposition reactor chamber; conveying as a first precursor the above-described composition; chemisorbing the amido-group-containing vapor deposition precursor on the surface of the substrate; removing any non-chemisorbed amido-group-containing vapor deposition precursor from the reactor; conveying a second precursor in a gaseous form to the reactor; reacting the first and second precursors to form a film on the substrate; and removing any unreacted second precursor.

As used throughout this specification, the following abbreviations shall have the following meanings, unless the context clearly indicates otherwise: ° C.=degrees centigrade; g=grams; mL=milliliters; Me=methyl; Et=ethyl; i-Pr=iso-propyl; n-Bu=n-butyl; s-Bu=sec-butyl; t-Bu=tert-butyl; t-Am=tert-amyl; DAA=dialkylamino including di(silyl-substituted alkyl)amino, disilylamino, or di(alkyl-substituted silyl)amino; EMA=ethylmethylamido; Cp=cyclopentadienyl; MeCp=methylcyclopentadienyl; EtCp=ethylcyclopentadienyl; CDI=N,N'-di-isopropylcarbodiimide; CO=carbon monoxide; Bz=benzene; AMD=amidinato; FAMD=formamidinato; PAMD=phoshoamidinato; DMA=dimethylamido; TMG=tetramethylguanidinato; PMDETA=pentamethyldiethylenetriamine; and THF=tetrahydrofuran.

"Halogen" refers to fluorine, chlorine, bromine and iodine and "halo" refers to fluoro, chloro, bromo and iodo. Likewise, "halogenated" refers to fluorinated, chlorinated, brominated and iodinated. "Alkyl" includes linear, branched and cyclic alkyl. Likewise, "alkenyl" and "alkynyl" include linear, branched and cyclic alkenyl and alkynyl, respectively. As used herein, cyclopentadienyl and heterocyclopentadienyl ligands encompass fused-ring systems including but not limited to indenyl and fluorenyl radicals. Hydrocarbyl structures specifically include $C_1$-$C_{30}$ linear, branched, and cyclic alkyl, and aromatic fused rings and pendant rings. The articles "a" and "an" refer to the singular and the plural.

Unless otherwise noted, all amounts are percent by weight and all ratios are molar ratios. All numerical ranges are inclusive and combinable in any order except where it is clear that such numerical ranges are constrained to add up to 100%.

The compositions of the present invention include an amido-group-containing vapor deposition precursor including a metal or metalloid chosen from a transition metal, phosphorus, antimony and arsenic, and a stabilizing additive compound capable of sharing electrons with the metal or metalloid.

Any amido-group containing vapor phase precursor may suitably be used in the present invention. As used herein, the term "amido-group-containing vapor deposition precursor" refers to vapor phase precursors having one or more groups chosen from amidinato, formamidinato, haloamidinato, phosphoamidinato, guanidinato, phosphoguanidinato, and $(R^1)NR^2$ wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl, wherein such groups have a bonding interaction between the nitrogen of such group and the metal or metalloid of such precursor. The transition metals include the lanthanide metals. Phosphorus, antimony and arsenic are metalloids (or semi-metals). Exemplary metals and metalloids useful in the present vapor deposition precursors include, but are not limited to, P, As, Sb, Zn, Sc, Y, Cu, Ag, Au, Lu, La, Ti, Zr, Hf, Nb, W, Mn, Co, Ni, Ru, Rh, Pd, Ir and Pt. Particularly suitable metals include, without limitation, La, Ti, Zr, Hf, Nb, W, Mn, Co, Ni, Ru, Rh, Pd, Ir and Pt. Exemplary amido groups include, but are not limited to, $(C_1-C_6)$alkylamino such as methylamino, ethylamino and propylamino; ans di$(C_1-C_6)$alkylamino such as dimethylamino, diethylamino, ethylmethylamino and dipropylamino. Exemplary amidinate groups include dimethyl acetamidinato, di-isopropyl acetamidinato and tertiarybutyl ethyl propioamidinato. Exemplary formamidinate groups include diethylformamidinato, di-isopropyl formamidinato, and ethyl isopropyl formamidinato. Exemplary guanidinates include tetramethylguanidinates and tetraethylguanidinates. Exemplary phosphoamidinates include N,P-dimethyl-methylphosphoamidinato, N,P-diethyl-methylphosphoamidinato, N,P-diethyl-ethylphosphoamidinato, N,P-di-iso-propyl-methylphosphoamidinato, N,P-di-iso-propyl-iso-propylphosphoamidinato, and N,P-dimethyl-phenylphosphoamidinato.

Exemplary vapor deposition precursors have the formula (amido)$_n$M$^{+m}$L$^1_{(m-n)}$L$^2_p$ wherein M=a transition metal, phosphorus, antimony or arsenic; L$^1$=an anionic ligand; L$^2$=a neutral ligand; m=the valence of M; n=1-6; p=0-3; and m is greater than or equal to n; amido=amidinato, formaminato, haloamidinato, phosphoamidinato, guanidinato, phosphoguanidinato, and $(R^1)NR^2$ wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl. The subscript "n" represents the number of amido ligands in the present compounds. The vapor deposition precursors may be heteroleptic or homoleptic. When m=n, the compounds are homoleptic. When n is greater than 1, the amido groups may be the same or different. Exemplary groups for each of $R^1$ and $R^2$ include without limitation methyl, ethyl, propyl, butyl, vinyl, allyl, butenyl, acetylenyl, propynyl, and substituted- or unsubstituted-aryl groups. Exemplary aryl groups include, but are not limited to, phenyl, methylphenyl, ethylphenyl, iso-propylphenyl, benzyl, tolyl and xylyl. As used herein, "substituted" refers to the replacement of a hydrogen by another substituent group, such as $(C_1-C_6)$alkyl, $(C_1-C_{12})$alkoxy, and halo. Exemplary substituent groups include, without limitation, tert-butyl, iso-butyl, iso-propyl, tert-butoxy, iso-butoxy, iso-propoxy, and fluoro.

A wide variety of anionic ligands (L$^1$) may be used in the present invention. Such ligands bear a negative charge. The anionic ligands (L$^1$) are not amido ligands. Suitable anionic ligands include, without limitation: hydride, halide, azide, alkyls, alkenyl, alkynyl, amino, alkylamino, dialkylamino, di(silyl-alkyl)amino, disilylamino, di(alkyl-silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, beta-diketonato, beta-diiminato, beta-ketoiminato, and pyrazolates. Any of such ligands may be optionally substituted such as by replacing one or more hydrogens with another substituent group such as halo, amino, disilylamino and silyl. Exemplary anionic ligands include, but are not limited to: $(C_1-C_{10})$alkyl such as methyl, ethyl, propyl, butyl, pentyl, hexyl, cyclopropyl, cyclopentyl and cyclohexyl; $(C_2-C_{10})$alkenyl such as ethenyl, allyl, and butenyl; $(C_2-C_{10})$alkynyl such as acetylenyl and propynyl; $(C_1-C_{10})$alkoxy such as methoxy, ethoxy, propoxy, and butoxy; cyclopentadienyls such as cyclopentadienyl, methylcyclopentadienyl, ethylcyclopentadienyl and pentamethylcyclopentadienyl; di$(C_1-C_{10})$alkylamino$(C_1-C_{10})$ alkoxy such as dimethylaminoethoxy, diethylaminoethoxy, dimethylaminopropoxy, ethylmethylaminopropoxy- and diethylaminopropoxy; silyls such as $(C_1-C_{10})$alkylsilyls and $(C_1-C_{10})$alkylaminosilyls. Preferred anionic ligands are cyclopentadienyls and $(C_1-C_{10})$alkoxy. When two or more anionic ligands are present, such ligands may be the same or different.

Neutral ligands (L$^2$) may be optional in the present compounds. Such neutral ligands do not bear an overall charge. Neutral ligands include, without limitation, CO, NO, nitrogen (N$_2$), amines, phosphines, alkylnitriles, alkenes, alkynes, and aromatic compounds. The term "alkene" includes any aliphatic compound having one or more carbon-carbon double bonds. Exemplary neutral ligands include, but are not limited to: $(C_2-C_{10})$alkenes such as ethene, propene, 1-butene, 2-butene, 1-pentene, 2-pentene, 1-hexene, 2-hexene, norbornene, vinylamine, allylamine, vinyltri$(C_1-C_6)$alkylsilane, divinyldi$(C_1-C_6)$alkylsilane, vinyltri$(C_1-C_6)$alkoxysilane and divinyldi$(C_1-C_6)$alkoxysilane; $(C_4-C_{12})$dienes such as butadiene, cyclopentadiene, isoprene, hexadiene, octadiene, cyclooctadiene, norbornadiene and α-terpinene; $(C_6-C_{16})$ trienes; $(C_2-C_{10})$alkynes such as acetylene and propyne; and aromatic compounds such as benzene, o-xylene, m-xylene, p-xylene, toluene, o-cymene, m-cymene, p-cymene, pyridine, furan and thiophene. Suitable amines include, without limitation, compounds of the formula NR$^3$R$^4$R$^5$, wherein each of R$^3$, R$^4$ and R$^5$ is independently chosen from H, $(C_1$-$C_6)$alkyl and aryl. Exemplary amines are ammonia, methylamine, dimethylamine, trimethylamine, ethylamine, diethylamine, triethylamine, and ethylmethylamine. Suitable phosphines include, without limitation, compounds of the formula PR$^6$R$^7$R$^8$, wherein each of R$^6$, R$^7$ and R$^8$ is independently chosen from H, $(C_1-C_6)$alkyl and aryl. Exemplary phosphines are phosphine, methylphosphine, dimethylphosphine, trimethylphosphine, triethylphosphine, and triphenylphosphine. The number of neutral ligands depends upon the particular metal chosen for M. When two or more neutral ligands are present, such ligands may be the same or different.

The amido-group-containing vapor deposition precursors may be prepared by a variety of methods known in the art. For example, the precursors may be prepared by reacting a lithium dialkylamide salt with a metal halide in a suitable solvent such as an ether. Such reaction may be performed over a range of temperatures, with room temperature being suitable for certain reactions. In an alternate synthesis of the precursors, an alkyl lithium may be first reacted with a metal halide in a suitable solvent, such as amine or ether such as THF, and at a suitable temperature, such as room temperature, followed by reaction with a dialkylamine in a suitable solvent, which is typically the same solvent as used for the first reaction.

A wide variety of stabilizing additive compounds may be used in the present compositions. The stabilizing additive is capable of sharing electrons with the metal or metalloid of the vapor deposition precursor. That is, the stabilizing additive is a capable of being a ligand for the metal or metalloid of the vapor deposition precursor. The stabilizing additive may be neutral or anionic. It is preferable that the stabilizing additive is neutral. Suitable stabilizing additives include, but are not limited to, compounds containing one or more of nitrogen, phosphorus, oxygen, sulfur and conjugated dienes, more preferably one or more of nitrogen, phosphorus, and oxygen. Such stabilizing additives can be monodenate, bidentate, or multidentate ligands. Exemplary stabilizing additives include, but are not limited to, amidines, formamidines, haloamidine, phosphoamidines, guanidines, phosphoguanidines, beta-diketones, beta-diketoiminates, alcohols, polyols such as glycols, amines including alkyl amines, dialkylamines and arylamines, polyamines, carbodiimides, alkyl carbodiimides, cyclopentadienes, thioethers, mercaptans and mixtures thereof. The stabilizing additive used in the present compositions is preferably different from the ligands used in the vapor deposition precursor. Compounds useful as stabilizing additives are generally commercially available, such as from Sigma-Aldrich (Milwaukee, Wis.).

In the present compositions, the stabilizing additive compound is present in an amount of 0.01 to 3 molar equivalent based on the vapor deposition precursor. Preferably, the amount of the stabilizing additive is from 0.01 to 2.5 molar equivalents based on the vapor deposition precursor, more preferably from 0.01 to 2, yet more preferably from 0.05 to 1.5, and still more preferably from 0.1 to 1.5. The amount of the stabilizing additive used is insufficient to act as a solvent for the vapor deposition precursor.

The present compositions may be prepared by combining the amido-group-containing vapor deposition precursor with the stabilizing additive compound; heating the combination of the vapor deposition precursor and the stabilizing additive; and mixing the vapor deposition precursor and the stabilizing additive to form a mixture. Optionally, a solvent may be used to prepare the present compositions. Such solvents are typically substantially free of metallic and oxygenated impurities, i.e. they contain less than 0.005% of such impurities. The heating and mixing steps may be performed in any order and may be performed sequentially or concurrently. In general, the heating step is performed at a temperature of less than or equal to 90° C. More preferably, the heating step is performed at $\leq 70°$ C., and still more preferably at $\leq 60°$ C. Temperatures >90° C. may be employed if high boiling ($\geq 100°$ C.) solvents are used. Mixing may be by any suitable means such as by stirring, blending or agitating. It is preferred that the mixture by substantially homogeneous. Optionally, the process includes the further step of removing volatile organic components following the heating step. Alternatively, the removal of volatile organic components may be performed during the heating step. The removal of such volatile organic components may be achieved by any suitable method, such as by purging the mixture or subjecting the mixture to reduced pressure, or a combination of any suitable methods.

The present compositions are particularly suitable for use as precursors for the vapor deposition of metal, metal oxide, metal nitride, metal silicate, and metal silicon oxynitride thin films. Such compositions may be used in a variety of CVD processes as well as in a variety of ALD processes. Two or more of such compositions may be used in a CVD or ALD process. When two or more compositions are used, such compositions may contain the same metal but have different ligands, or may contain different metals and have the same ligands, or may contain different metals and different ligands. The selection of such second composition is well within the ability of one skilled in the art. Alternatively, the present compositions may be used in combination with any suitable vapor deposition precursor.

Bubblers (also known as cylinders) are the typical delivery devices used to provide organometallic compounds in the vapor phase to a deposition reactor. Such bubblers typically contain a fill port, a gas inlet port and an outlet port which is connected to a deposition chamber. A carrier gas typically enters the bubbler through the gas inlet port and entrains or picks up precursor vapor. The gas containing precursor vapor then exits the bubbler through the outlet port and is conveyed to the deposition chamber. A variety of carrier gases may be used, such as hydrogen, helium, nitrogen, argon and mixtures thereof.

A wide variety of bubblers may be used, depending upon the particular deposition apparatus used. When the precursor compound is a solid, the bubblers disclosed in U.S. Pat. Nos. 6,444,038 (Rangarajan et al.) and 6,607,785 (Timmons et al.), as well as other designs, may be used. For liquid precursor compounds, the bubblers disclosed in U.S. Pat. Nos. 4,506,815 (Melas et al.) and 5,755,885 (Mikoshiba et al.) may be used, as well as other liquid precursor bubblers. The source compound is maintained in the bubbler as a liquid or solid. Solid source compounds are typically vaporized or sublimed prior to transportation to the deposition chamber. Bubblers for use with ALD processes may have pneumatic valves at the inlet and outlet ports to facility opening and closing as required to provide the necessary vapor pulses.

In conventional CVD processes, a bubbler for supplying a liquid precursor, as well as certain bubblers for supplying solid precursors, will contain a dip tube which is connected to the gas inlet port. In general, the carrier gas is introduced below the surface of the organometallic compound and travels upward through the source compound to the headspace above it, entraining or carrying vapor of the precursor compound in the carrier gas. Cylinders that do not contain such a dip tube may also be used with the present compositions.

Precursors used in ALD processes are often liquids, low melting solids, or solids formulated in a solvent. To handle these types of precursors, bubblers used in ALD processes may contain a dip tube connected to the outlet port. Gas enters these bubblers through the inlet, pressurizes the bubbler and forces the precursor up the dip tube and out of the bubbler.

The present invention provides a delivery device including the composition described above for feeding a fluid stream saturated with the composition described above to a chemical vapor deposition system. The delivery device may include a vessel having an elongated cylindrical shaped portion having an inner surface having a cross-section, a top closure portion and a bottom closure portion, the top closure portion having an inlet opening for the introduction of a carrier gas and an outlet opening, the elongated cylindrical shaped portion having a chamber containing the organometallic compound described above. Other types of delivery devices may also be used. Also provided by the present invention is an apparatus for chemical vapor deposition of metal films including one or more devices for feeding a fluid stream saturated with the composition described above.

The deposition chamber is typically a heated vessel within which is disposed at least one, and possibly many, substrates. The deposition chamber has an outlet, which is typically connected to a vacuum pump in order to draw by-products out of the chamber and to provide a reduced pressure where that is appropriate. Metalorganic CVD ("MOCVD") can be conducted at atmospheric or reduced pressure. The deposition chamber is maintained at a temperature sufficiently high to induce decomposition of the source compound. The typical deposition chamber temperature is from 200 to 1200° C., more typically from 200 to 600° C., the exact temperature selected being optimized to provide efficient deposition. Optionally, the temperature in the deposition chamber as a whole can be reduced if the substrate is maintained at an elevated temperature, or if other energy such as plasma is generated by a radio frequency source.

Suitable substrates for deposition, in the case of electronic device manufacture, may be silicon, silicon germanium, silicon carbide, gallium nitride, gallium arsenide, indium phosphide, and the like. Such substrates are particularly useful in the manufacture of integrated circuits and memory chips.

Deposition is continued for as long as desired to produce a film having the desired properties. Typically, the film thickness will be from several hundred to several thousand angstroms or more when deposition is stopped.

Thus, the present invention provides a method for depositing a thin film including a) providing a substrate in a vapor deposition reactor; b) conveying as a precursor the composition described above in a gaseous form to the reactor; and c) depositing a thin film including a metal or metalloid on the substrate. In a typical CVD process, the above described method further includes the step of decomposing the precursor in the reactor.

Thin metal (or metalloid)-containing films (metal or metal oxide or metal nitride or metal silicate or metal silicon oxynitride) are produced by ALD with almost perfect stoichiometry by alternately subjecting the substrate, one at a time, to the vapor of precursor compounds of each of the elements of which the film is formed. In ALD processes, a substrate is subjected to the vapor of a first precursor which can react with the surface of the substrate at a temperature sufficiently high for such reaction to occur whereby a single atomic layer of the first precursor (or metal contained therein) is formed on the surface of the substrate, and subjecting the thus formed surface with the first precursor atomic layer thereon to the vapor of a second precursor which reacts with the first precursor at a temperature sufficiently high for such reaction to occur whereby a single atomic layer of the desired metal film is formed on the surface of the substrate. This procedure can be continued by alternately using the first and second precursors until the film that is formed reaches a desire to thickness. The temperatures used in such ALD processes are typically lower than those employed in MOCVD process and may be in the range of 200 to 400° C., although other suitable temperatures may be employed depending upon the precursors chosen, the film to be deposited, and on other criteria known to those skilled in the art.

An ALD apparatus typically includes a vacuum chamber means to provide an evacuated atmosphere, a pair of means situated in the vacuum chamber means, the pair of means including a support means for supporting at least one substrate and a source means for forming sources for as least two vapors of two different precursors, respectively, and operating means operatively connected with one of the pair of means for operating the one means with respect to the other of the pair of means for providing on the substrate first a single atomic layer of one of the precursors and then a single atomic layer of the other precursor. See, e.g., U.S. Pat. No. 4,058,430 (Suntola) for a description of an ALD apparatus.

The present invention provides a method of depositing a thin film including providing a substrate in a vapor deposition reactor; conveying as a first precursor the composition described above; chemisorbing the amido-group-containing vapor deposition precursor on the surface of the substrate; removing any non-chemisorbed amido-group-containing vapor deposition precursor from the reactor; conveying a second precursor in a gaseous form to the reactor; reacting the first and second precursors to form a film on the substrate; and removing any unreacted second precursor. The alternating steps of conveying the first and second precursors and step of reacting the first and second precursors being repeated until a film of the desired thickness is obtained. The step of removing a precursor from the reactor may include one or more of evacuating the reactor under vacuum and purging the reactor using a non-reactant gas and/or solvent vapor. The second precursor may be any suitable precursor that reacts with the first precursor to form the desired film. Such second precursors may optionally contain another metal or metalloid. Exemplary second precursors include, but are not limited to, oxygen, ozone, water, peroxide, alcohols, nitrous oxide and ammonia.

When the present compositions are to be used in ALD processes or in direct liquid injection processes, they may be combined with an organic solvent. Any organic solvents which dissolve and are suitably inert to the composition, as well as match the vapor pressure, thermal stability, and polarity of the composition can be employed. Exemplary organic solvents include, without limitation, aliphatic hydrocarbons, aromatic hydrocarbons, linear alkyl benzenes, halogenated hydrocarbons, silyated hydrocarbons, alcohols, ethers, glymes, glycols, aldehydes, ketones, carboxylic acids, sulphonic acids, phenols, esters, amines, alkylnitrile, thioethers, thioamines, cyanates, isocyanates, thiocyanates, silicone oils, nitroalkyl, alkylnitrate, and mixtures thereof. Suitable solvents include tetrahydrofuran, diglyme, polyglyme, n-butyl acetate, octane, 2-methoxyethyl acetate, ethyl lactate, 1,4-dioxane, vinyltrimethylsilane, pentamethyl diethylene triamine (PMDETA), pyridine, mesitylene, toluene, and xylene. Mixtures of organic solvents may be used. When used in direct liquid injection processes, the concentration of the composition is typically in the range of 0.05 to 0.25 Molar, and more typically 0.05 to 0.15 Molar. The composition/organic solvent compositions are typically solutions. Suitable direct liquid injection processes are those described in U.S. Patent Application No. 2006/0110930 (Senzaki).

Further provided by the present invention is a method for manufacturing an electronic device including the step of depositing a thin film using any one of the above described methods.

The present invention provides a vapor deposition process using compositions, particularly for ALD, which have a suitable balance of functionality, desired thermal stability, higher vapor pressures than comparable vapor deposition precursors themselves. The use of conventional precursors in ALD processes often leads to early decomposition of the precursor with resulting particle formation. Such particles may accumulate in the reactor, vapor transfer lines or on the substrate. Particle formation may clog the reactor and such particles are detrimental to the growth of defect-free films. The present compositions provide cleaner films that are free of deposits, particles, and surface defects such as roughness and compositional non-uniformity as compared to the corresponding vapor deposition precursors with such stabilizing additive. The present compositions also have longer shelf life and reduced safety issues as compared to t the corresponding vapor deposition precursors with such stabilizing additive.

To be useful in ALD processes, a precursor should not decompose at temperatures at or below 140° C., and preferably at or below 150° C. One way to determine such decomposition temperatures is by the use of accelerated rate calorimetry. A suitable calorimeter is the ARC™ adiabatic calorimeter available from Arthur D. Little. In use, a sample is placed in a spherical bomb that is connected to a sealed pressure measurement system. A thermocouple is attached to the outside of the bomb and the bomb is placed in the center of the calorimeter assembly. The calorimeter assembly has 3 zones, each zone having its own thermocouple and heaters. The ARC™ calorimeter uses a heat-wait-search-exotherm program. The calorimeter and the sample are heated to a start temperature. The sample and calorimeter temperatures equilibrate during the wait portion of the program. Next, the calorimeter monitors the sample for self-heating during the search portion of the program. If self-heating greater than a predetermined rate of 0.02° C./minute is not detected, the program repeats the sequence until the sample exceeds the exotherm threshold which triggers the exotherm portion of the program, or until a maximum upper limit temperature or pressure is reached. If self-heating of the sample is detected (exceeds 0.02° C./minute), the heating program shifts to adiabatic tracking. In this way, the onset temperature of the exotherm is determined.

The following examples are expected to illustrate various aspects of the present invention.

EXAMPLE 1

Comparative

Tetrakis(ethylmethylamido)zirconium (800 g) was prepared by the reaction of lithium ethylmethylamide and zirconium tetrachloride in tetrahydrofuran/hexane reaction solvents by using the procedures as described in the literature (see, e.g., D. C. Bradley and I. M. Thomas, *J. Chem. Soc.*, 1960, pp 3857-3861). The reaction was carried out under a constant blanket of nitrogen, and all reagents were freshly prepared and purified to avoid the contamination by deleterious impurities. The product, tetrakis(ethylmethylamido)zirconium, was subjected to accelerated reaction calorimetry measurement to measure the heat generation initiating temperature and time to maximum rate. The results are shown in FIG. 1.

Figure 1:
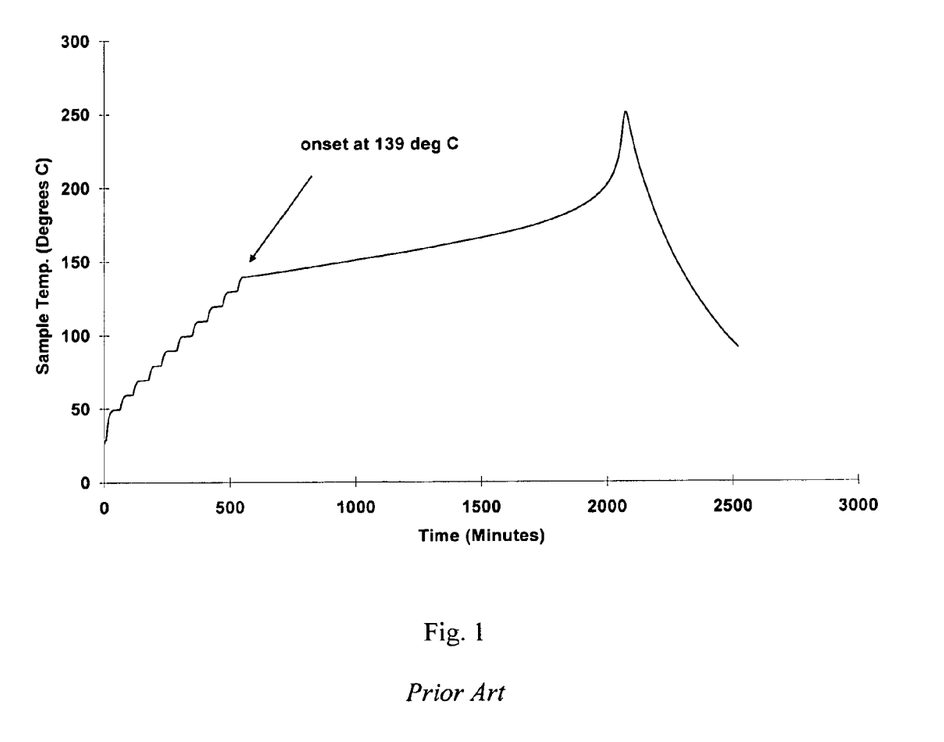
FIG. 1 shows a plot of sample temperature versus time for a conventional amido-group-containing vapor deposition precursor.

As can be seen from FIG. 1, tetrakis(ethylmethylamido) zirconium has low thermal stability and decomposes even at a low temperature (onset of thermal degradation at 139° C.) after a short period of time (approximately 500 minutes). Tetrakis(ethylmethylamido)zirconium shows a large self-heat generation rate (corresponding to the decomposition rate) even at low temperatures and/or shows the maximum of the self-heat generation rate after a short period of time under adiabatic conditions.

EXAMPLE 2

The product from Example 1, i.e. tetrakis(ethylmethylamido)zirconium, (TEMAZr, 26 g, 0.08 moles) was combined with neat N,N'-dimethyl acetamidine (14 g, 0.16 moles). The reaction mass was stirred to ensure good mixing. It was then warmed gently (about 50° C.) to affect the dissolution. After mixing and dissolving the N,N'-dimethyl acetamidine in TEMA-Zr, the pale yellow reaction mass was stirred for 30 minutes. It was then heated to 58° C., and the volatile organic impurities were removed during this heating step. The composition was further purified by evacuation and pot-to-pot distillation at 55° C. and 8 mTorr (1.07 Pa) pressure for 4 hours. The yield of the final product was 32 g after purification. The formulation product was analyzed by $^1$H NMR to confirm the presence of additive at the desired level (N,N'-dimethyl acetamidine:TEMA-Zr present at 2:1 molar ratio). The composition was subjected to accelerated reaction calorimetry measurement to measure heat generation initiating temperature and time to maximum rate. The onset of decomposition was noted at 160° C. and the rate at onset was found to be 0.051372° C./min. This result confirmed that TEMAZr-N,N'-dimethyl acetamidine composition has greater thermal stability than TEMA-Zr.

EXAMPLE 3

To a stirred solution of tetrakis(ethylmethylamido)zirconium in degassed linear alkyl benzene (100 mL), is added dropwise the methylcyclopentadiene monomer (5% w/w) prepared by thermally dissociating the methylcyclopentadiene dimer. The reaction mixture is heated for 30 minutes and volatile impurities are driven off under nitrogen stream. The composition is distilled under vacuum, and is expected to possess greater thermal stability than tetrakis(ethylmethylamido)zirconium.

EXAMPLE 4

To a stirred solution of tetrakis(dimethylamido)hafnium in degassed hexane (100 mL), is added dropwise the di-isopropyl formamidine (10% w/w). The reaction mixture is heated for 30 minutes and volatile impurities including some hexane are driven off under nitrogen stream. The composition is distilled under vacuum, and is expected to possess greater thermal stability than tetrakis(dimethylamido)hafnium.

EXAMPLE 5

To a stirred solution of tertiarybutylimido-tris(ethylmethylamido)tantalum in degassed linear alkyl benzene (100 mL), is added dropwise the linear alkyl benzene solution of dipivaloylmethane (or 2,2,6,6-tetramethylheptane-3,5-dione or "thd"). The reaction mixture is heated for 45 minutes and volatile impurities are driven off under nitrogen stream. The resulting composition is distilled under vacuum, and is expected to possess greater thermal stability thantertiarybutylimido-tris(ethylmethylamido)tantalum.

EXAMPLE 6

To a stirred suspension of tetrakis(ethylmethylamido)zirconium in degassed linear alkyl benzene (100 mL), is added dropwise the di-isopropyl acetamidine (7.5% w/w) and dimethylcyclopentadiene monomer (5% w/w) prepared by thermally dissociating the dimethylcyclopentadiene dimer. The reaction mixture is heated for 30 minutes and volatile impurities are driven off under nitrogen stream. The composition is distilled under vacuum, and is expected to possess greater thermal stability than tetrakis(ethylmethylamido)zirconium.

EXAMPLE 7

Compositions of enhanced thermal stability and suitable for use in ALD or direct liquid injection processes are prepared by combining the amido-group-containing vapor deposition precursors with the stabilizing additives set forth in the following table according to the procedure set forth in Example 2. The vapor deposition precursors and stabilizing additives are typically present in a molar stoichiometry of 1:0.01 to 1:3, respectively, in these compositions.

| Composition Sample | Amido-group-containing Vapor Deposition Precursor | Stabilizing Additive (mole %) |
|---|---|---|
| 1 | TEMAZr | CDI (20) |
| 2 | TEMAHf | Di-methyl formamidine (45) |
| 3 | TDMATi | mmpH (65) |
| 4 | PEMATa | Di-methyl acetamidine (35) |
| 5 | BDMIBDMAW | MeCpH(15) |
| 6 | TBTDET | thd (10) |
| 7 | AMITDET | CDI (7.5) |
| 8 | TDMAP | Di-isopropyl acetamidine (40) |
| 9 | TDMASb | Di-tert-butyl acetamidine (60) |
| 10 | La(AMD)$_3$ | MP (55) |
| 11 | Sc(FAMD)$_3$ | DBZM (21) |
| 12 | Lu(FAMD)(EMA) | Di-isopropyl acetamidine (39) |
| 13 | BTBIBEMAMo | N,N'-ethyl methyl acetamidine (33) |
| 14 | TEMAZr | N,N'-methyl propyl acetamidine (66) |
| 15 | TBTDET | MP (57) |
| 16 | [Cu(AMD)]$_2$ | EtCpH (13) |
| 17 | Ag(FAMD) | N,N'-s-butyl methyl acetamidine (17) |
| 18 | Gd(DMA)$_2$(FAMD) | Di-s-butyl acetamidine (9) |
| 19 | Dy(EMA)(AMD)$_2$ | Di-methyl acetamidine (62) |

As used in the table, the abbreviations have the following meanings:
TEMA = tetrakis(ethylmethylamido);
PEMA = pentakis(ethylamido);
TDMA = tetrakis(dimethylamido);
mmpH = 1-methoxy-2-methyl-2-propanol;
BDMIBDMAW = bis(dimethylimido)-bis(dimethylamido)tungsten;
TBTDET = tert-butylimido-tris(diethylamido)tantalum;
AMITDET = amylimido-tris(diethylamido)tantalum:
TDMAP = trisdimethylamidophosphorus;
TDMASb = trisdimethylamidoantimony;
MP = methylpyrrolidine;
DBZM = dibenzoylmethane;
BTBIBEMAMo = bis(tert-butyimido)-bis(ethylmethylamiso)molybdenum; and
hfac = 1,1,1,5,5,5-hexafluoro-2,4,pentanedionate.

EXAMPLE 8

The compositions in the following table are expected to be produced using one or more of the procedures described above. The starting materials and procedure to be used are provided in the table. The products are expected to exhibit greater thermal stability than the corresponding vapor deposition precursor used to make the compositions.

| Vapor Deposition Precursor A | Amido-group Containing Vapor Deposition Precursor | Stabilizing Additive I (mole %) | Stabilizing Additive II (mole %) | Procedure |
|---|---|---|---|---|
| Zr(O-tBu)$_4$ | Zr(NMe$_2$)$_4$ | Me$_2$-AMD(H) (18) | — | Example 2 |
| — | Hf(NMe$_2$)$_4$ | MeCpH (6) | Me$_2$-AMD(H) (19) | Example 2 |
| Hf(O-iPr)$_4$ | Zr(NEtMe)$_4$ | dpm (10) | Me$_2$-AMD(H) (20) | Example 3 |
| Zr(NEt$_2$)$_4$ | Zr(NMe$_2$)$_4$ | mmpH (15) | t-Bu$_2$-AMD(H) (10) | Example 2 |
| Al(NMe$_2$)$_3$ | Hf(NEtMe)$_4$ | i-Pr$_2$-AMD(H) (33) | — | Example 2 |
| Hf(NMe$_2$)$_4$ | Zr(NMe$_2$)$_4$ | acac (15) | Me$_2$-AMD(H) (15) | Example 2 |
| — | Ti(NEt$_2$)$_4$ | CDI (12) | t-Bu$_2$-AMD(H) (35) | Example 9 |
| Ta(O-iPr)$_5$ | TBTDET | t-Bu$_2$-AMD(H) (28) | — | Example 3 |
| — | V(NMe$_2$)$_3$(CO)$_2$ | MP (5) | — | Example 2 |
| — | W(NtBu)$_2$(NMeEt)$_2$ | s-Bu$_2$-AMD(H) (45) | — | Example 2 |
| Ru(EtCp)$_2$ | Ru(CO)$_2$(tBu$_2$-AMD)$_2$ | tBu$_2$-AMD(H) (22) | — | Example 2 |
| — | Hf(NMe$_2$)$_2$(NEtMe)$_2$ | Me$_2$-FAMD(H) (2) | — | Example 4 |
| — | (MeCp)$_2$Zr(NMe$_2$)(Me) | Me$_2$-AMD(H) (3) | — | Example 4 |
| Cp$_2$Mg | Zr(NMe$_2$)$_2$(NEtMe)$_2$ | iPr$_2$-AMD(H) (10) | MP (10) | Example 4 |
| | Zr(NEtMe)$_4$ | MeCpH (55) | Me$_2$-PAMD(H) (7) | Example 5 |

As used in the above table, the abbreviations have the following meanings:
acac = acetonylacetonate; and
dpm = dipivoylmethane.

EXAMPLE 9

Under $N_2$, TEMA-Zr (10 g, 0.031 mol) was placed into a 100 mL Schlenk flask. N,N'-di-isopropylcarbodiimide (3.9 g, 0.031 mol) was added dropwise to the TEMA-Zr slowly at −10° C. with moderate agitation, yielding a clear yellowish viscous liquid. Analysis of this liquid by $^1H$ NMR confirmed the presence of TEMA-Zr:N,N'-di-isopropylcarbodiimide (molar ratio=1:1).

This material was subjected to a thermal stability study by accelerated rate calorimetry testing. The thermal stability study indicated that no onset of thermal decomposition was detected up to 250° C. When compared with Example 1, it can be clearly seen that the addition of the stabilizing additive raises the thermal stability of the precursor by more than 110° C. Thus, the formulations of the present invention have increased thermal stability as compared to the precursor alone without the stabilizing additive.

EXAMPLE 10

Zirconium oxide ($ZrO_2$) films were grown using the precursor formulation from Example 9 and the Comparative precursor from Example 1.

A. The precursor formulation (1.17 g) from Example 9 was placed into a source boat from an ASM F-120 ALD reactor under $N_2$. The source temperature was set at 120° C. The primary and secondary purging gases were $N_2$, and their flow rates were 300 and 200 sccm, respectively. A 10 cm (4 inch) wafer of p-type silicon (Cz, single side polished) was placed in the ALD chamber and heated at 250° C. The pulse sequence was precursor/$N_2$ purge at 1 s/3 s and $O_3$/$N_2$ purge at 1 s/3 s. The $O_3$ pulse flow rate was regulated at 20 sccm from an ozone generator. 1000 Cycles were applied for the $ZrO_2$ thin film deposition.

A smooth, highly uniform $ZrO_2$ film was grown on the wafer after 100 cycles. The film thickness by spectroscopic ellipsometry was found to be approximately 89.8 nm. The un-optimized thin film growth rate was about 0.9 Å/cycle.

B. TEMA-Zr from Example 1 was used to attempt to grow a $ZrO_2$ film under the identical conditions as described above. No growth was found to occur under these conditions, and TEMA-Zr was found to decompose in the boat.

The following Table shows the comparison of film growths using TEMA-Zr and the precursor formulation from Example 9.

| Precursor Tested | TEMA-Zr | TEMA-Zr:N,N'-di-isopropylcarbodiimide |
|---|---|---|
| Thermal stability of Precursor | Decomposition of source at 100° C. | Growth with source at 120° C. (Growth also at 70, 100, 110° C.) |
| Growth Rate | 7.9 Å/min, 1.05 Å/cyc. (70° C.) No growth (100° C. and beyond) | 6.6 Å/min, 0.88 Å/cyc. (100° C.) 6.7 Å/min, 0.90 Å/cyc. (120° C.) |

EXAMPLE 11

Under $N_2$, TEMA-Hf (0.045 mol) is placed into a 100 mL Schlenk flask. 1-tert-butyl-3-ethylcarbodiimide (0.045 mol) is slowly added dropwise to the TEMA-Hf at −10° C. with moderate agitation, to afford a formulation of TEMA-Hf: 1-tert-butyl-3-ethylcarbodiimide in a molar ratio of 1:1. Analysis of this formulation by accelerated rate calorimetry testing is expected to show a similar thermal stability to the precursor formulation of Example 9.

EXAMPLE 12

Under $N_2$, TBTDET (0.065 mol) is placed into a 100 mL Schlenk flask. N,N'-Dicyclohexylcarbodiimide (0.065 mol) is slowly added dropwise to the TBTDET at −10° C. with moderate agitation, to afford a formulation of TBTDET:N, N'-dicyclohexylcarbodiimide in a molar ratio of 1:1. Analysis of this formulation by accelerated rate calorimetry testing is expected to show a similar thermal stability to the precursor formulation of Example 9.

EXAMPLE 13

Under $N_2$, TEMA-Ti (0.045 mol) is placed into a 100 mL Schlenk flask. N,N'-Di-isopropylcarbodiimide (0.045 mol) is slowly added dropwise to the TBTDET at −10° C. with constant stirring, to afford a formulation of TEMA-Ti:N,N'-di-isopropylcarbodiimide in a molar-ratio of 1:1. Analysis of this formulation by accelerated rate calorimetry testing is expected to show a similar thermal stability to the precursor formulation of Example 9.

EXAMPLE 14

Figure 2:
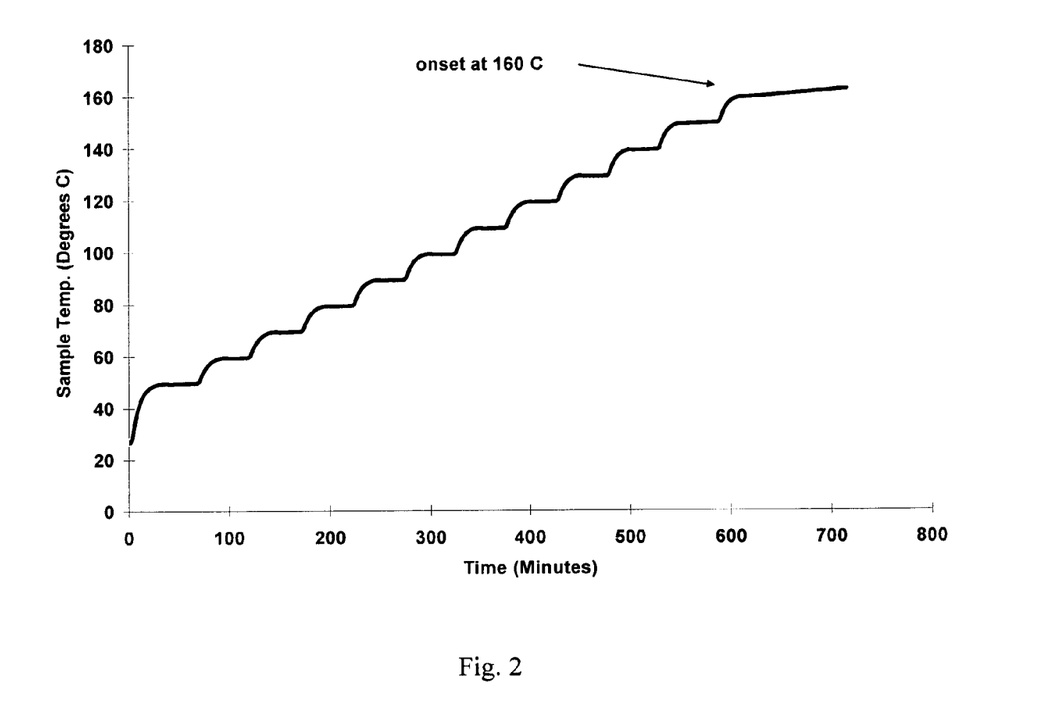
FIG. 2 shows a plot of sample temperature versus time for a composition of the invention.

The product from Example 1, i.e. tetrakis(ethylmethylamido)zirconium, (23 g, 0.07 moles) was combined with a solution of N,N'-dimethyl acetamidine in toluene. The latter was prepared by adding N,N'-dimethyl acetamidine (6 g, 0.07 moles) to toluene (28 g, 30 mL) and gentle warming to affect the dissolution. After mixing the acetamidine solution and tetrakis(ethylmethylamido)zirconium, the pale yellow reaction mass was stirred for 30 minutes. It was then heated to 110° C., and the volatile organic impurities were removed during this heating step. The composition was further purified by evacuation and pot-to-pot distillation at 70° C. and 8 mTorr (1.07 Pa) pressure. The composition was analyzed by NMR to confirm the presence of additive at the desired level (N,N'-dimethyl acetamidine present at 25 mole %). The composition was subjected to accelerated reaction calorimetry measurement to measure heat generation initiating temperature and time to maximum rate. The results are shown in FIG. 2.

Tetrakis(ethylmethylamido)zirconium-N,N'-dimethyl acetamidine composition has greater thermal stability, decomposes at a comparatively higher temperature over a longer period of time, and shows a large self-heat generation rate than tetrakis(ethylmethylamido)zirconium.

What is claimed is:

1. A composition for the vapor phase deposition of a thin film comprising an amido-group-containing vapor deposition precursor comprising a metal or metalloid chosen from a transition metal, phosphorus, antimony and arsenic, and a stabilizing additive compound capable of sharing electrons with the metal or metalloid, wherein the stabilizing additive compound is present in an amount of 0.01 to 3 molar equivalent based on the vapor deposition precursor, wherein the stabilizing additive compound is chosen from carbodiimides, alkyl carbodiimides, and mixtures thereof, and wherein the stabilizing additive compound is different from any ligands present in the vapor deposition precursor.

2. The composition of claim 1 wherein the vapor deposition precursor has the formula $(amido)_n M^{+m} L^1_{(m-n)} L^2_p$ wherein M=a transition metal, phosphorus, antimony or arsenic; $L^1$=an anionic ligand; $L^2$=a neutral ligand; m=the valence of M; n=1-6; p=0-3; and m is greater than or equal to n; amido=amidinato, formaminato, haloamidinato, phosphoamidinato, guanidinato, phosphoguanidinato, and $(R^1)NR^2$ wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl, wherein $L^1$ is not amido.

3. The composition of claim 1 wherein the stabilizing additive compound is present in an amount of 0.01 to 2 equivalents based on the vapor deposition precursor.

4. The composition of claim 2 wherein $L^1$ is chosen from hydride, halide, azide, alkyls, alkenyl, alkynyl, amino, alkylamino, dialkylamino, di(silyl-alkyl)amino, disilylamino, di(alkyl-silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, beta-diketonato, beta-diiminato, beta-ketoiminato, and pyrazolates.

5. The composition of claim 4 wherein $L^1$ is chosen from hydride, azide, alkyls, alkenyl, alkynyl, amino, alkylamino, dialkylamino, di(silyl-alkyl)amino, disilylamino, di(alkyl-silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, beta-diketonato, beta-diiminato, beta-ketoiminato, and pyrazolates.

* * * * *